United States Patent
Han et al.

(10) Patent No.: US 8,741,434 B2
(45) Date of Patent: Jun. 3, 2014

(54) TRANSPARENT CONDUCTIVE FILMS CONTAINING CARBON NANOTUBES AND TOUCH PANEL

(75) Inventors: Joong Tark Han, Changwon-si (KR); Geon Woong Lee, Changwon-si (KR); Hee Jin Jeong, Changwon-si (KR); Jong Seok Woo, Gumi-si (KR)

(73) Assignee: Korea Electrotechnology Research Institute (KR)

( * ) Notice: Subject to any disclaimer, the term of this patent is extended or adjusted under 35 U.S.C. 154(b) by 603 days.

(21) Appl. No.: 12/247,005

(22) Filed: Oct. 7, 2008

(65) Prior Publication Data

US 2010/0040887 A1    Feb. 18, 2010

(30) Foreign Application Priority Data

Aug. 14, 2008 (KR) ........................ 10-2008-0080045

(51) Int. Cl.
- B27B 27/04 (2006.01)
- B32B 9/00 (2006.01)
- B27B 27/06 (2006.01)
- C08K 3/04 (2006.01)
- H01B 5/14 (2006.01)

(52) U.S. Cl.
USPC .................... 428/411.1; 428/357; 428/408

(58) Field of Classification Search
None
See application file for complete search history.

(56) References Cited

U.S. PATENT DOCUMENTS

| | | | |
|---|---|---|---|
| 2005/0042450 A1* | 2/2005 | Sano et al. ................ | 428/375 |
| 2006/0051579 A1* | 3/2006 | Chokai et al. .............. | 428/375 |
| 2006/0052509 A1* | 3/2006 | Saitoh ....................... | 524/496 |
| 2006/0105146 A1* | 5/2006 | Bourdelais et al. ......... | 428/166 |
| 2006/0188723 A1* | 8/2006 | Rowley et al. .............. | 428/408 |
| 2006/0274049 A1* | 12/2006 | Spath et al. ................. | 345/173 |
| 2007/0158610 A1* | 7/2007 | Hong et al. .................. | 252/71 |
| 2007/0182457 A1* | 8/2007 | Yasuda ........................ | 327/1 |
| 2007/0231561 A1* | 10/2007 | Pellerite et al. ............. | 428/323 |

(Continued)

FOREIGN PATENT DOCUMENTS

WO    WO2005104141    * 11/2005

OTHER PUBLICATIONS

University of Wisconsin-Madison, The Nanotechnology Activity Guides—How Small is Nanotubes? http://mrsec.wisc.edu/Edetc/IPSE/educators/activities/supplements/nanotube-Handout.pdf Retrieved on Sep. 26, 2011.*

(Continued)

*Primary Examiner* — Callie Shosho
*Assistant Examiner* — Coris Fung
(74) *Attorney, Agent, or Firm* — Park & Associates IP Law, P.C.

(57) ABSTRACT

Disclosed herein is a transparent conductive polycarbonate film coated with carbon nanotubes, including a transparent conductive layer formed by applying a mixed solution of carbon nanotubes and a binder on one side or both sides of a transparent polycarbonate film, and a touch panel using the transparent conductive polycarbonate film as a lower transparent electrode. The present invention provides a transparent conductive polycarbonate film coated with a mixed solution of carbon nanotubes and a binder, by which a touch panel having high transmissivity can be manufactured by directly forming a transparent conductive layer on a polycarbonate film used as a protective film of a liquid crystal display using carbon nanotubes, without using a polyethylene terephthalate (PET) substrate used for a transparent electrode of a conventional touch panel, by which the production cost of the touch panel can be decreased, and by which a thin touch panel can be manufactured.

6 Claims, 3 Drawing Sheets

(56) References Cited

U.S. PATENT DOCUMENTS

| | | | |
|---|---|---|---|
| 2008/0029292 A1* | 2/2008 | Takayama et al. | 174/126.4 |
| 2008/0286559 A1* | 11/2008 | Lee et al. | 428/323 |
| 2009/0032777 A1 | 2/2009 | Kitano et al. | |
| 2009/0155460 A1 | 6/2009 | Ruoff | |

OTHER PUBLICATIONS

Curbell Plastics—Polycarbonate http://www.curbellplastics.com/engineering-plastics/polycarbonate.html . Retrieved on Sep. 27, 2011.*

Takayama et al., WO2005-104141 machine translation, Nov. 3, 2005.*

Omnexus, What is Polycarbonate? Retrieved on Aug. 18, 2012. http://www.omnexus.com/tc/polycarbonate/index.aspx.*

Cardinal, Fading. Retrieved on Aug. 18, 2012. http://www.cardinalcorp.com/wp-content/uploads/pdf/tsb/ig/IG11_05-08.pdf.*

Noguchi et al., Carbon Nanotubes as Fillers—Abstract, Journal of the Society of Rubber Industry, Japan, vol. 78;No. 6;p. 205-210(2005).*

Nanocyl, Multi-wall Nanotubes (MWNT) (Nanocyl). Retrieved on Apr. 11, 2013. http://www.nanocyl.com/CNT-Expertise-Centre/Carbon-Nanotubes/Multi-wall-Nanotubes.*

HyperPhysics—Electromagnetic Spectrum (HyperPhysics). Retrieved on Apr. 11, 2013. http://hyperphysics.phy-astr.gsu.edu/hbase/ems1.html.*

* cited by examiner

FIG. 1(A) - PRIOR ART

TRANSPARENT CONDUCTIVE FILMS CONTAINING CARBON NANOTUBES AND TOUCH PANEL

FIELD OF THE INVENTION

The present invention relates to a transparent conductive polycarbonate film coated with carbon nanotubes and a touch panel using the same, and, more particularly, to a transparent conductive polycarbonate film coated with carbon nanotubes, by which a touch panel having high transmissivity can be manufactured through simple processes, without using a conventional polyethylene terephthalate (PET) substrate coated with indium tin oxide (ITO), and a touch panel using the same.

BACKGROUND OF THE INVENTION

Generally, a transparent conductive film must have high conductivity (surface resistance of $1 \times 10^3$ Ω/sq or less) and high transmissivity in a visible region. Such a transparent conductive film is used to manufacture plasma display panels (PDPs), liquid crystal displays (LCDs), light emitting diodes (LEDs), organic light emitting displays (OLEDs), touch panels, solar cells, and the like.

Particularly, in the present invention, a transparent conductive film used to manufacture a touch panel will be described.

Generally, a touch panel is an apparatus for recognizing input signals generated by touching letters or figures displayed on a liquid crystal display screen with hands or touch pens without using additional input devices, such as keyboards, mousse, and the like.

Such a touch panel, as shown in FIG. 1A, includes: a liquid crystal display (LCD) screen 10; a protective layer 20 formed on the liquid crystal display (LCD) screen 10 to protect the liquid crystal display (LCD) screen 10; a transparent conductive film formed on the protective layer 20, the transparent conductive film including a lower transparent electrode 30, an upper transparent electrode 40, and a spacer 50 interposed therebetween; and an external protective layer 60 made of polymethylmethacrylate (PMMA), the external protective layer being formed by a hard coating method.

The protective layer 20 for protecting the liquid crystal display screen 10 is generally made of polycarbonate, and the lower transparent electrode 30 and upper transparent electrode 40, which constitute a transparent conductive film, must function as electrodes and simultaneously have a transmissivity of 70% or more in a visible region.

Conventionally, an indium tin oxide (hereinafter, referred to as 'ITO') electrode is most widely used to manufacture the transparent electrode. The ITO is advantageous in that it has excellent physical properties and has been frequently used in a process of manufacturing a transparent electrode to date, but is problematic in that, since indium oxide ($In_2O_3$) is obtainable from a zinc (Zn) mine just as a by-product, the supply and demand thereof is unstable. Further, ITO film is problematic in that since the ITO film does not have flexibility, it cannot be used for flexible products, and further in that since the ITO film is manufactured under high temperature and high pressure conditions, the production cost thereof is increased.

Further, when the protective layer formed on the liquid crystal display is coated with the ITO in order to be used as the transparent electrode of the touch panel, the most important problem is the adhesion between the ITO and the polycarbonate constituting the protective layer. Generally, since the adhesion between the ITO and polycarbonate is not high, a polyethylene terephthalate (PET) substrate is coated with ITO, and then adhered on the protective layer made of polycarbonate.

However, this method is problematic in that the transmissivity of the liquid crystal display screen is decreased, and in that a process of coating a polyethylene terephthalate (PET) substrate with ITO is additionally conducted, so that costs are increased, thereby increasing the thickness of the touch panel.

SUMMARY OF THE INVENTION

Accordingly, the present invention has been made keeping in mind the above problems occurring in the prior art, and an object of the present invention is to provide a transparent conductive polycarbonate film coated on one side or both sides thereof with a mixed solution of carbon nanotubes and a binder, by which a touch panel having high transmissivity can be manufactured by directly forming a transparent conductive layer on a polycarbonate film used as the protective film of a liquid crystal display using carbon nanotubes, without using a polyethylene terephthalate (PET) substrate used for a transparent electrode of a conventional touch panel, by which the production cost of the touch panel can be decreased, and by which a thin touch panel can be manufactured.

In order to accomplish the above object, the present invention provides a transparent conductive polycarbonate film coated with carbon nanotubes, including a transparent conductive layer formed by applying a mixed solution of carbon nanotubes and a binder on one side or both sides of a transparent polycarbonate film, and a touch panel using the transparent conductive polycarbonate film as a lower electrode.

Further, it is preferred that the carbon nanotubes be selected from among single-wall carbon nanotubes, double-wall carbon nanotubes, multi-wall carbon nanotubes, and mixtures thereof.

Further, it preferred that the transparent conductive polycarbonate film have a surface resistance of $1 \times 10^3$ Ω/sq or less and a transmissivity of 70% or more in a wavelength of 540~560 nm.

Further, it preferred that, in the coating of the mixed solution of carbon nanotubes and a binder, the transparent conductive polycarbonate film be provided on one side or both sides thereof with a mono-layered transparent conductive layer having a predetermined amount of a binder or a multi-layered transparent conductive layer having different amounts of a binder.

Further, it is preferred that the multi-layered transparent conductive layer include a conductive layer; and a protective layer formed on the conductive layer or an adhesive layer beneath the conductive layer.

Further, it is preferred that the conductive layer have a lower binder content than that of the adhesive layer or the protective layer.

Further, it is preferred that the multi-layered transparent conductive layer include an adhesive layer formed on the polycarbonate film; a conductive layer formed on the adhesive layer; and a protective layer formed on the conductive layer. Further, it is preferred that the amount of a binder included in the adhesive layer be 20~99.9 parts by weight based on 100 parts by weight of a mixture of carbon nanotubes and a binder, that the amount of a binder included in the conductive layer be 0.1~50 parts by weight based on 100 parts by weight of a mixture of carbon nanotubes and a binder, and that the amount of a binder included in the protective layer be 20~99.9 parts by weight based on 100 parts by weight of a mixture of carbon nanotubes and a binder.

Further, it is preferred that the multi-layered transparent conductive layer include an adhesive layer formed on the polycarbonate film; and a conduction-protection mixed layer, serving as both a conductive layer and a protective layer, formed on the adhesive layer. Further, it is preferred that the amount of a binder included in the adhesive layer be 20~99.9 parts by weight based on 100 parts by weight of a mixture of carbon nanotubes and a binder, and the amount of a binder included in the conduction-protection mixed layer be 0.1~70 parts by weight based on 100 parts by weight of a mixture of carbon nanotubes and a binder.

Further, it is preferred that the multi-layered transparent conductive layer include a conduction-adhesion mixed layer, serving as both a conductive layer and an adhesive layer, formed on the polycarbonate film, and a protective layer formed on the conduction-adhesion mixed layer. Further, it is preferred that the amount of a binder included in the conduction-adhesion mixed layer be 0.1~70 parts by weight based on 100 parts by weight of a mixture of carbon nanotubes and a binder, and the amount of a binder included in the protective layer be 20~99.9 parts by weight based on 100 parts by weight of a mixture of carbon nanotubes and a binder.

Here, it is preferred that the binder be selected from among thermoplastic resins, thermosetting resins, photo-curable resins, silane compounds, titanium compounds, copolymers, self-assembled resins, conductive polymers, and combinations thereof.

Further, it is preferred that the carbon nanotube have an outer diameter of 0.5~15 nm.

BRIEF DESCRIPTION OF THE DRAWINGS

The above and other objects, features and advantages of the present invention will be more clearly understood from the following detailed description taken in conjunction with the accompanying drawings, in which:

FIG. 1A is a schematic sectional view showing a conventional touch panel;

DETAILED DESCRIPTION OF THE INVENTION

Hereinafter, preferred embodiments of the present invention will be described in detail with reference to the attached drawings.

The present invention provides a transparent conductive polycarbonate film provided thereon with a transparent conductive layer by coating a transparent polycarbonate with a one-component mixed solution of carbon nanotubes and a binder on one side or both sides thereof.

The transparent conductive polycarbonate film must have a surface resistance of $10^3$ Ω/sq or less and a transmissivity of 70% or more in a wavelength of 540~560 nm, and can be used as an electrode of various transparent displays.

Particularly, since the transparent conductive polycarbonate film is prepared by directly forming a transparent conductive layer composed of nanotubes on a polycarbonate film used as a protective film of a liquid crystal display in a conventional touch panel, a touch panel having higher transmissivity than a conventional touch panel can be manufactured, a thin touch panel can be manufactured, and the production cost of the touch panel can be decreased without using a polyethylene terephthalate (PET) substrate coated with ITO used in order to improve the adhesion between the ITO and the conventional polycarbonate film.

Figure 1B:
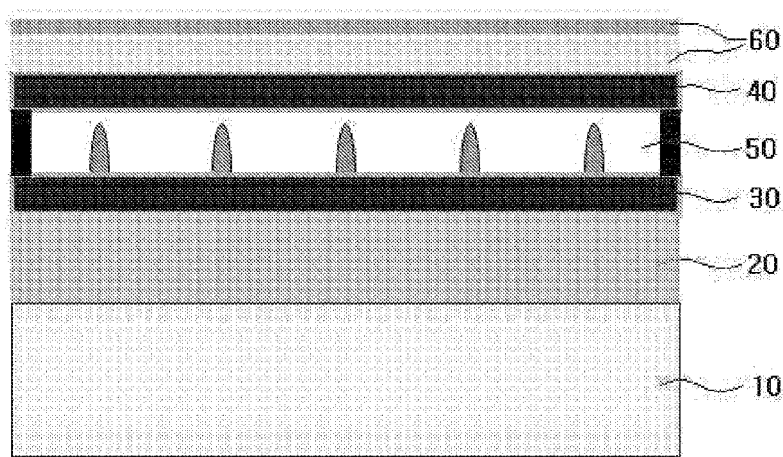
FIG. 1B is a schematic sectional view showing a touch panel according to an embodiment of the present invention.
Figure 1B:
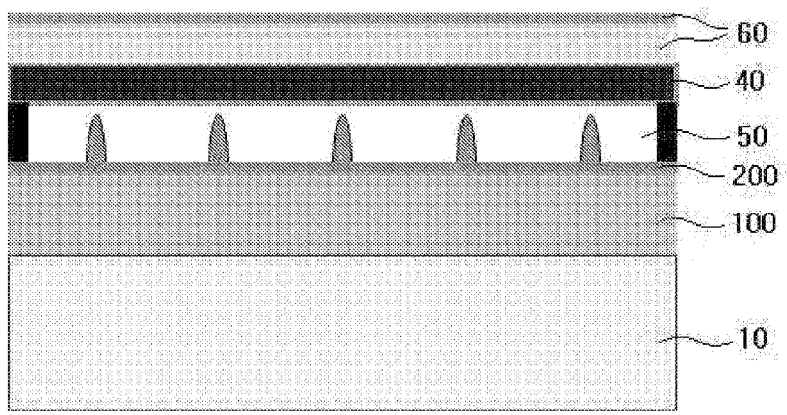

FIG. 1A is a schematic sectional view showing a conventional touch panel, and FIG. 1B is a schematic sectional view showing a touch panel according to an embodiment of the present invention. As shown in FIG. 1A, the conventional touch panel includes a protective layer 20 for protecting a liquid crystal display screen 10; a transparent conductive film formed on the protective layer 20, the transparent conductive film including a lower transparent electrode 30, an upper transparent electrode 40, and a spacer 50 interposed therebetween; and an external protective layer 60.

Figure 2A:
FIG. 2A is a photograph showing a transparent conductive polycarbonate film including a transparent conductive layer composed of carbon nanotubes, having a thickness of 1 mm, according to an embodiment of the present invention.
Figure 2B:
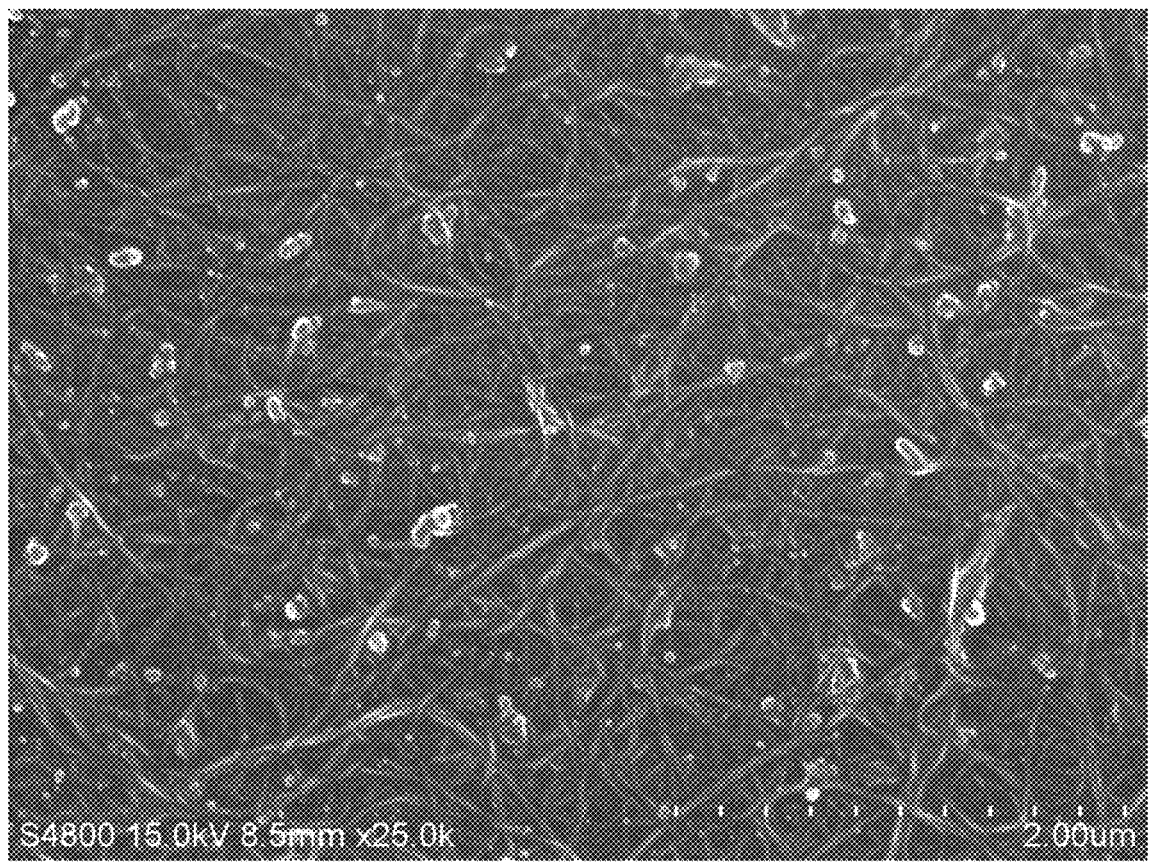
FIG. 2B is a scanning electron microscope photograph showing a transparent conductive polycarbonate film according to an embodiment of the present invention.

In the conventional touch panel, a polyethylene terephthalate (PET) film coated with ITO, which is formed on a polycarbonate film 20, is used as the lower transparent electrode 30. In contrast, according to the touch panel of the present invention, as shown in FIG. 1B, a transparent conductive layer 200 composed of carbon nanotubes, which is formed on a polycarbonate film 100, is used as the lower transparent electrode 30. Here, the upper transparent electrode 40 of the conventional touch panel may be directly used in the touch panel of the present invention. FIG. 2A is a photograph showing a transparent conductive polycarbonate film including a transparent conductive layer composed of carbon nanotubes according to an embodiment of the present invention, and FIG. 2B is a scanning electron microscope photograph showing a transparent conductive polycarbonate film according to an embodiment of the present invention.

In the present invention, a transparent conductive polycarbonate film on which a mono-layered transparent conductive layer having a predetermined amount of a binder is formed may be manufactured, or a transparent conductive polycarbonate film on which a multi-layered transparent conductive layer is formed may be manufactured by sequentially coating a polycarbonate film with a plurality of mixed solutions of carbon nanotubes and a binder depending on the function and use of the conductive polycarbonate film.

The mono-layered transparent conductive layer may simultaneously serve as a conductive layer, a protective layer and an adhesive layer. In this case, it is preferred that the amount of a binder included in the mono-layered transparent conductive layer be 10~99.9 parts by weight based on 100 parts by weight of a mixture of carbon nanotubes and a binder.

The multi-layered transparent conductive layer must include a conductive layer in order to ensure conductivity, and a protective layer or an adhesive layer must be formed on or beneath the conductive layer. These conductive, protective and adhesive layers are formed by preparing a mixed solution of nanotubes and a binder depending on the amount of the binder and then applying the mixed solution onto a polycarbonate film.

The protective layer formed on the conductive layer serves to prevent the scattering of nanoparticles including nanotubes constituting the conductive layer and to improve the chemical resistance, moisture resistance and scratch resistance of a transparent conductive polycarbonate film.

The adhesive layer which is formed beneath the conductive layer, that is, on the polycarbonate film, serves to maintain the adhesion between the conductive layer and polycarbonate film and thus to improve the durability of the transparent conductive polycarbonate film, that is, the durability thereof against a touch pen at the time of use of a touch panel.

These conductive, protective and adhesive layers, if necessary, may be formed into two layers including a conductive layer and a protective layer or a conductive layer and an adhesive layer, or may be formed into three layers including a conductive layer, a protective layer and an adhesive layer. If necessary, these layers may be repeatedly formed regularly or irregularly.

Considering that the conductivity of these conductive layers, protective layers and adhesive layers generally decreases with the increase in the amount of a binder, the amount of the binder in the conductive layer is lower than the amount of the binder in the protective layer or adhesive layer.

When the transparent conductive layer formed on the polycarbonate film includes three layers, that is, when an adhesive layer, conductive layer and a protective layer are formed on the polycarbonate film, it is preferred that the amount of a binder included in the adhesive layer be 20~99.9 parts by weight based on 100 parts by weight of a mixture of carbon nanotubes and a binder, the amount of a binder included in the conductive layer be 0.1~50 parts by weight based on 100 parts by weight of a mixture of carbon nanotubes and a binder, and the amount of a binder included in the protective layer be 20~99.9 parts by weight based on 100 parts by weight of a mixture of carbon nanotubes and a binder.

When the amount of the adhesive layer or protective layer is higher that that of the conductive layer, durability against a touch pen as well as electrical conductivity must be ensured. As described above, when the transparent conductive layer includes three layers, the transparent conductive layer is configured such that the maximum amount of a binder included in the conductive layer is 50 parts by weight based on 100 parts by weight of a mixture of carbon nanotubes and a binder, and thus conductivity is relatively increased.

That is, basically, in the adhesive layer, conductive layer and protective layer formed on a polycarbonate film, each of them exhibit conductivity, the adhesivity of the portion thereof to which the polycarbonate film is adhered is improved, and the surface of the conductive layer is treated such that the protective function for preventing the scattering of nanoparticles is improved, thereby entirely making up for the function of the conductive layer.

Meanwhile, when the transparent conductive layer formed on the polycarbonate film includes two layers, the transparent conductive layer includes an adhesive layer formed on the polycarbonate film and a conduction-protection mixed layer for simultaneously performing functions of a conductive layer and a protective layer formed on the adhesive layer, or includes a conduction-adhesion mixed layer formed on the polycarbonate film and a protective layer formed on the conduction-adhesion mixed layer.

When the transparent conductive layer includes the adhesive layer and conduction-protection mixed layer, it is preferred that the amount of a binder included in the adhesive layer be 20~99.9 parts by weight based on 100 parts by weight of a mixture of carbon nanotubes and a binder, and the amount of a binder included in the conduction-protection mixed layer be 0.1~70 parts by weight based on 100 parts by weight of a mixture of carbon nanotubes and a binder.

Even when the transparent conductive layer includes the adhesive layer and conduction-protection mixed layer, the transparent conductive layer basically has conductivity. In this case, the transparent conductive layer is configured such that the maximum amount of a binder included in the adhesive layer is 99.9 parts by weight based on 100 parts by weight of a mixture of carbon nanotubes and a binder, so that the adhesion between the conductive layer and polycarbonate film is improved, thereby a transparent conductive polycarbonate film including the transparent conductive layer can be used in the fields of requiring durability.

When the transparent conductive layer includes the conduction-adhesion mixed layer and protective layer, it is preferred that the amount of a binder included in the conduction-adhesion mixed layer be 0.1~70 parts by weight based on 100 parts by weight of a mixture of carbon nanotubes and a binder, and the amount of a binder included in the protective layer be 20~99.9 parts by weight based on 100 parts by weight of a mixture of carbon nanotubes and a binder.

Even when the transparent conductive layer includes the conduction-adhesion mixed layer and protective layer, the transparent conductive layer basically has conductivity. In this case, the transparent conductive layer is configured such that the maximum amount of a binder included in the conduction-adhesion mixed layer is 70 parts by weight based on 100 parts by weight of a mixture of carbon nanotubes and a binder and the minimum amount of a binder included in the protective layer is 20 parts by weight based on 100 parts by weight of a mixture of carbon nanotubes and a binder, so that the hybrid function between the conductive layer and adhesive layer can be performed and the protective layer having a high binder content prevent the scattering of nanoparticles, thereby a transparent conductive polycarbonate film including the transparent conductive layer can be used in the fields of requiring chemical resistance, moisture resistance and scratch resistance.

As described above, since the multi-layered transparent conductive layer is formed depending on the amount of binder, the function of the protective layer can be improved and the function of the adhesive layer can be more improved while the function of the conductive layer being basically maintained, depending on the use of a transparent conductive polycarbonate film.

Here, carbon nanotubes may be selected from among single-wall carbon nanotubes, double-wall carbon nanotubes and multi-wall carbon nanotubes.

As the carbon nanotubes, relatively cheap carbon nanotubes having an outer diameter of less than 15 nm may be used. In conventional technologies, only the carbon nanotubes having an outer diameter of less 3 nm are used. However, the present invention makes it possible to use carbon nanotubes having a larger outer diameter than the outer diameter of the carbon nanotubes used in the conventional technologies through the improvement of dispersibility. In the case of multi-wall nanotubes, since their refractive indices are changed due to the increase in thickness of multi-walls and their transmissivity is deteriorated due to Rayleigh scattering, multi-wall nanotubes having a particle size of less than wavelength $(\lambda)/20$ must be used in consideration of the dispersion of particles, etc. Considering the transparency of film and the dispersibility of carbon nanotubes, carbon nanotubes having an outer diameter of less than 15 nm $(d<\lambda/20 \rightarrow d<\sim 15$ nm$)$ can be used in the visible region. The reason for this is that the dispersibility of carbon nanotubes is improved by the solvent and binder according to the present invention.

In order to primarily disperse carbon nanotubes, the carbon nanotubes are dissolved in a solvent. Here, the solvent may be a polar solvent or a nonpolar solvent, and may be one or more selected from the group consisting of acetone, methylethyl ketone, methyl alcohol, ethyl alcohol, isopropyl alcohol, butyl alcohol, ethylene glycol, polyethylene glycol, tetrahydrofuran, dimethylformamide, dimethylacetamide, N-methyl-2-pyrrolidone, hexane, cyclohexanone, toluene, chloroform, distilled water, dichlorobenzene, dimethylbenzene, trimethylbenzene, pyridine, methylnaphthalene, nitromethane, acrylonitrile, octadecylamine, aniline, dimethylsulfoxide. The selected one or more solvents are prepared into a carbon nanotube-dispersed solution.

Further, in order to disperse carbon nanotubes in the solvent, an ultrasonic dispersion method or a ball milling method is used. That is, carbon nanotubes are uniformly dispersed in the solvent by applying them in an ultrasonic dispersion apparatus having a frequency of 20~50 kHz and a power of 50~700 W for 1~60 hours.

Further, when carbon nanotubes are dispersed in the solvent, a dispersion stabilizer is added thereto, so that the dispersity of the carbon nanotubes into the solvent is further improved, with the result that the finally produced transparent conductive polycarbonate film can be maintained in a stable state without changing the physical properties thereof, thereby providing a transparent conductive polycarbonate film having uniform properties.

Here, before the carbon nanotube-dispersed solution is prepared, in order to ensure the dispersibility and dispersion stability of carbon nanotubes into a solvent and a binder, surface functionalization through acid treatment may be performed. In the acid treatment, the acid may be selected from among nitric acid, chloric acid, sulfuric acid and a mixture thereof, and thus carboxylic groups are introduced into the end and surface of the carbon nanotubes. That is, carbon nanotubes are washed with distilled water and simultaneously residual acid is removed therefrom, and then the carbon nanotubes are filtered and dried, thereby obtaining refined carbon nanotubes substituted with carboxylic groups. These refined carbon nanotubes are dispersed in the solvent to prepare a carbon nanotube-dispersed solution, and then a binder is added to the carbon nanotube-dispersed solution.

A mixed solution of carbon nanotubes and a binder may be prepared by mixing a binder with the carbon nanotube-dispersed solution at the time of preparing the carbon nanotube-dispersed solution or by additionally preparing a binder solution in which a binder is mixed with a polar or nonpolar solvent and then mixing the binder solution with the carbon nanotube-dispersed solution. Here, the amount of a binder is suitably determined in the above range in consideration of the use, transparency and electrical conductivity of a transparent conductive polycarbonate film, and a plurality of mixed solutions of carbon nanotubes and a binder is prepared.

Generally, the amount of a binder is an important factor for determining the adhesivity to polycarbonate film, electrical conductivity, transmissivity, dispersibility, chemical stability, durability and scratch resistance. When the amount of a binder is increased, the adhesivity to polycarbonate film, dispersibility, chemical stability, durability and scratch resistance are increased, but the electrical conductivity and transmissivity are decreased. Considering this, the mixed solution of carbon nanotubes and a binder is prepared by selecting the optimal amount of a binder.

Here, the binder may be selected from among thermoplastic resins, thermosetting resins, photo-curable resins, silane compounds, titanium compounds, copolymers, self-assembled resins, conductive polymers, and combinations thereof. The binder serves to improve the dispersibility of carbon nanotubes, improve the adhesivity to a polycarbonate film, and improve chemical stability, durability and scratch resistance.

Here, a method of coating a polycarbonate film with the mixed solution of carbon nanotubes and a binder may be performed by any one method selected from among spraying, dip coating, spin coating, screen coating, ink-jet printing, pad printing, knife coating, kiss coating, and gravure coating. In addition, before the coating process, the viscosity of the mixed solution of carbon nanotubes and a binder is controlled through the addition of a solvent or reduced-pressure distillation depending on each of the coating methods, and then the viscosity-controlled mixed solution of carbon nanotubes and a binder may be applied on the polycarbonate film.

Through this coating method, the polycarbonate film is coated thereon with the mixed solution of carbon nanotubes and a binder such that the thickness thereof is several tens to several hundreds of nanometers. Subsequently, a solvent drying process and a process of curing a binder are performed, thus completing a transparent conductive film of the present invention.

Further, the solvent drying process and the process of curing the binder may be formed during the formation of a multi-layered transparent conductive layer, or may be formed after the completion of the entire multi-layered transparent conductive layer.

As described above, the present invention provides a transparent conductive polycarbonate film coated with a mixed solution of carbon nanotubes and a binder, by which a touch panel having high transmissivity can be manufactured by directly forming a transparent conductive layer on a polycarbonate film used as a protective film of a liquid crystal display using carbon nanotubes, without using a polyethylene terephthalate (PET) substrate used for a transparent electrode of a conventional touch panel, by which the production cost of the touch panel can be decreased, and by which a thin touch panel can be manufactured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A transparent conductive polycarbonate film, comprising a multi-layered transparent conductive layer formed on at least one side of a transparent polycarbonate film, wherein the multi-layered transparent conductive layer comprises an adhesive layer disposed on one surface of the transparent polycarbonate film, a protective layer, and a primary conductive layer interposed between the adhesive layer and the protective layer, wherein the primary conductive layer, the adhesive layer and the protective layer each each comprise double-wall or multi-wall carbon nanotubes with carboxylic groups introduced at the end and surface of the carbon nanotubes and a binder, and wherein the primary conductive layer, the adhesive layer and the protective layer have different amount of binder mixed therein.

2. The transparent conductive polycarbonate film of claim 1, wherein the transparent conductive polycarbonate film has a surface resistance of $1\times10^3$ $\Omega$/sq or less and a transmissivity of 70% or more in a wavelength of 540~560 nm.

3. The transparent conductive polycarbonate film of claim 2, wherein an amount of the binder included in the adhesive layer is 20~99.9 parts by weight based on 100 parts by weight of a mixture of the carbon nanotubes and binder, an amount of the binder included in the primary conductive layer is 0.1~50 parts by weight based on 100 parts by weight of the mixture of the carbon nanotubes and binder, and an amount of the binder included in the protective layer is 20~99.9 parts by weight based on 100 parts by weight of the mixture of the carbon nanotubes and binder, and wherein the binder is selected from the group consisting of photo-curable resins, silane compounds, titanium compounds, copolymers, self-assembled resins, and combinations thereof.

4. A touch panel, comprising:

a transparent polycarbonate substrate for protecting a directly adjacent liquid crystal display screen;

a lower transparent electrode formed on the transparent polycarbonate substrate;

an upper transparent electrode; and a spacer interposed between the lower transparent electrode and the upper transparent electrode, wherein the lower transparent electrode is a multi-layered transparent conductive layer including an adhesive layer, a protective layer and a primary conductive layer interposed between the adhesive layer and the protective layer, in which each of the adhesive layer, the protective layer and the primary conductive layer comprises carbon nanotubes with carboxylic groups introduced at the end and surface of the carbon nanotubes and different amount of a binder from each other mixed therein.

5. The touch panel of claim 4, wherein an amount of the binder included in the adhesive layer is 20~99.9 parts by weight based on 100 parts by weight of a mixture of the carbon nanotubes and binder, an amount of the binder included in the primary conductive layer is 0.1~50 parts by weight based on 100 parts by weight of the mixture of the carbon nanotubes and binder, and an amount of the binder included in the protective layer is 20~99.9 parts by weight based on 100 parts by weight of the mixture of the carbon nanotubes and binder, and wherein the binder is selected from the group consisting of photo-curable resins, silane compounds, titanium compounds, copolymers, self-assembled resins, and combinations thereof.

6. The touch panel of claim 5, wherein the lower transparent electrode has a surface resistance of $1 \times 10^3$ Ω/sq or less and a transmissivity of 70% or more in a wavelength of 540~560 nm.

* * * * *